United States Patent [19]

Hitchcock et al.

[11] Patent Number: 4,700,016

[45] Date of Patent: Oct. 13, 1987

[54] PRINTED CIRCUIT BOARD WITH VIAS AT FIXED AND SELECTABLE LOCATIONS

[75] Inventors: Robert B. Hitchcock, Wappingers Falls; Eduardo Kellerman, Endicott; John P. Koons, Apalachin, all of N.Y.

[73] Assignee: International Business Machines Corporation, Armonk, N.Y.

[21] Appl. No.: 863,850

[22] Filed: May 16, 1986

[51] Int. Cl.$^4$ ............................................. H05K 1/00
[52] U.S. Cl. ................................... 174/68.5; 361/416
[58] Field of Search ........................ 174/68.5; 361/416

[56] References Cited

U.S. PATENT DOCUMENTS

| | | | |
|---|---|---|---|
| 3,726,989 | 4/1973 | Lesley | 174/68.5 |
| 3,895,181 | 7/1975 | LaGrange et al. | 174/68.5 |
| 4,298,770 | 11/1981 | Nishihara et al. | 174/68.5 |
| 4,362,899 | 12/1982 | Borrill | 174/68.5 |
| 4,598,166 | 7/1986 | Neese | 174/68.5 |

FOREIGN PATENT DOCUMENTS 2553534  6/1977  Fed. Rep. of Germany ..... 174/68.5

OTHER PUBLICATIONS

Girvan, E. J. et al; "Interstitial Vias for Improved Wirability"; IBM Technical Disclosure Bulletin, vol. 26, No. 7A; Dec. '83; p. 3464.

*Primary Examiner*—Morris H. Nimmo
*Attorney, Agent, or Firm*—Perman & Green

[57] ABSTRACT

A printed circuit board for electric circuits is formed of plural layers of electrical conductors and includes through holes and vias arranged in a regular pattern along points of a grid laid out along othorgonal axes of a Cartesian coordinate system. Electrical components such as circuit chips and discrete components are to be mounted to the through holes, while the vias connect electrical conductors of different layers. Conductors of a layer are grouped together as multiple-conductor channels which are routed among the through holes and the vias to make electrical connections among the electrical components. An additional via can be entered in a central portion of a grid cell by rerouting conductors of channels in the cell through arcuate segments, thereby permitting connection between conductors of channels on different layers while preserving the original grid pattern of through holes and vias.

4 Claims, 9 Drawing Figures

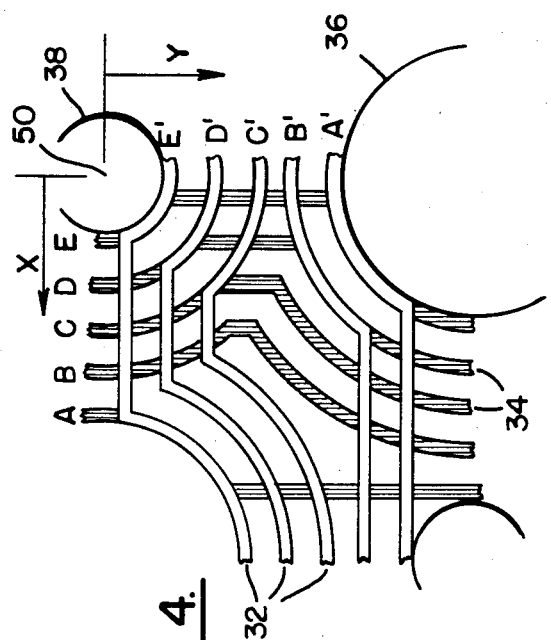
FIG. 4.
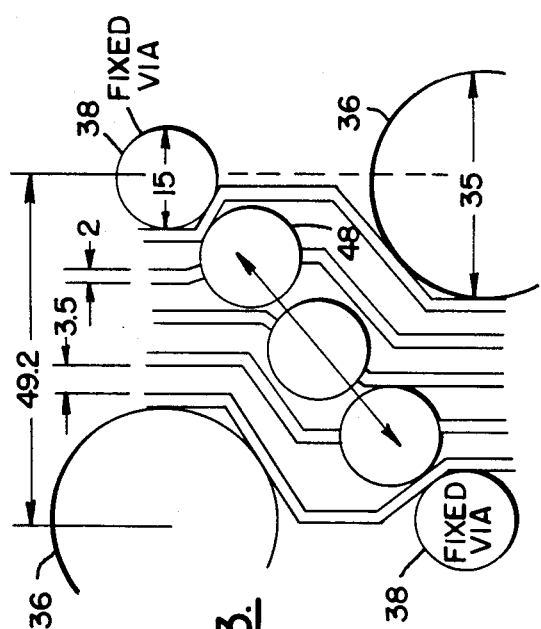
FIG. 3.
FIG. 5.
| TO | | FROM | | | | | | | | | | |
|---|---|---|---|---|---|---|---|---|---|---|---|---|
| | | A | | B | | C | | D | | E | | |
| | | X | Y | X | Y | X | Y | X | Y | X | Y | |
| E' | X | 30.5 | 18.7 | 25 | 20 | 19.5 | 14 | 14 | 16 | 0 | 0 | Y |
| D' | | 29 | 24 | 27.7 | 21.3 | 22 | 19 | 22 | 22 | 16 | 14 | |
| C' | | 31 | 29.5 | 30 | 27 | 24.6 | 24.6 | 19 | 22 | 14 | 19.5 | |
| B' | | 33 | 35 | 27 | 27 | 27 | 30 | 21.3 | 27.7 | 20 | 25 | |
| A' | | 49.2 | 49.2 | 35 | 33 | 29.5 | 31 | 24 | 29 | 18.7 | 30.5 | |

FROM "A" TO "E'"

FROM "B" TO "E'"

FROM "C" TO "D"

FROM "D" TO "B'"

PRINTED CIRCUIT BOARD WITH VIAS AT FIXED AND SELECTABLE LOCATIONS

BACKGROUND OF THE INVENTION

This invention relates to the construction of electric circuits on multiple-layer printed circuit boards having high wiring densities with through holes and vias disposed on a grid and, more particularly, to a circuit board and method for construction of such a board to provide for the inclusion of additional vias between points of the grid to access any one of a set of many wires, formed as strip conductors, passing between neighboring grid points for establishing electrical connection between wires on different layers of the board.

Printed circuit boards are employed frequently in the construction of complex electrical circuits. The boards may be formed as laminations of individual layers having electrical conductors etched from metal sheets. The metal sheets are insulated from each other by layers of insulating material. Connection between conductors on different layers is made by vias. Through holes passing through all the layers of a board are provided for mounting electrical components, such as encapsulated chip circuits and connectors, to the board.

In accordance with current manufacturing practice, all vias and through holes are located at points of a grid. This permits standardization of component sizes, particularly the sizes and spacings of legs which support a circuit component on a circuit board. The alternation of grid locations among the through holes and the vias maximizes the number of interlayer connection sites while maintaining full flexibility in selection of sites on a board for mounting a component.

The spacings between grid points has been sufficient to allow the passage of two wires, formed as strip conductors, between a through hole and a neighboring via. Thereby, as two of the strip conductors pass side-by-side along a layer of the board for connection between components mounted on the board, both of the conductors pass adjacent to vias to enable connection with another layer if desired. The conductor on the right may be electrically connected, as by soldering, to a via on the right, and the conductor on the left may be electrically connected to a via on the left. The paths travelled by the conductors among grid points located on a cartesian coordinate system may be parallel to an axis of the coordinate system, inclined to an axis, or a combination of parallel and inclined paths.

The efficiencies of such configurations of conductor paths are discussed in Nishihara et al, U.S. Pat. No. 4,298,770, issued Nov. 3, 1981. The most efficient routing is shown to include paths of varying inclination. With advancements in the technology of building printed circuit boards, it is now becoming feasible to construct narrower conductors, and to fit more than two conductors, possibly several conductors, in the standardized grid spacing between a through hole and a via. A passage between a through hole and a via, which passage may contain a plurality of conductors, may be referred to as a channel. Increasing the channel capacity is clearly advantageous because it provides a designer of printed circuit boards with greater flexibility in laying out the conductors, in connecting circuit components, and in locating such components.

A problem arises in that, with high channel capacity such as five conductors per channel, present circuit boards are limited in the amount of connections that can be provided to the individual conductors of a channel. The outer conductors pass adjacent to vias, as noted above, so as to make connection therewith as well as to terminals of circuit components. However, the inner conductors are isolated from the vias, and cannot be connected to a via until an outer conductor is terminated at a circuit component or at a via. This greatly restricts the utility of a many-conductor channel. Even a modified grid with additional vias disposed at fixed central points of grid elements would not offer appreciable advantage because such additional fixed-position vias, while presenting the opportunity for coupling to an inner conductor of a channel, would tend to block the passage way, and thereby generally limit the number of conductors which can be located in a channel.

SUMMARY OF THE INVENTION

The foregoing problem is overcome and other advantages are provided by the fabrication of a circuit board having a regular grid structure with fixed grid sites for the locations of through holes and vias arranged preferably in alternating fashion and wherein, in accordance with the invention, the circuit board includes multiple-conductor channels passing between the grid sites, and additional vias disposed within central portions of individual grid elements, but not at a fixed point within a grid element.

In accordance with a principle of the invention, it is noted that the central portion of a grid element is less constrictive to the passage of a conductor channel than the edge of a grid element. The additional space found at the central portion of a grid element is sufficient to accommodate one via and its land, provided that the via is placed directly in the path of the conductor to which the via is to be connected, and that the other conductors of the channel are formed as concentric arcs around one or more neighboring grid sites of the grid element.

The available space at the central region of the grid element is limited by the sizes of the lands of the through holes and the vias, and by the widths and the number of the conductors. In the case of a connection between a conductor of one channel with a conductor of a second channel running generally perpendicularly to the first channel and having an equal number of conductors, the central region has a generally rhombic form with the major axis of the rhombus extending along a line joining centers of the vias. The lands of the through holes are larger than the lands of the vias. The arcuate path segments of the conductors bypassing the additional via results in a spreading of the conductor pattern. Such spreading is limited by the lands of the through-holes and the vias at the grid sites. Due to the difference in sizes of the lands, the region for locating the additional via has the foregoing generally rhombic shape. The location of the additional via is at the junction of the loci of possible locations for a given conductor of the first channel and the loci of possible locations for a given conductor of the second channel.

BRIEF DESCRIPTION OF THE DRAWING

The foregoing aspects and other features of the invention are explained in the following description, taken in connection with the accompanying drawing wherein:

FIG. 3 shows spacing of grid points in a standard form of circuit board, and also shows possible locations for the additional via along a diagonal within the central region of a square grid cell bounded by two through holes and two vias arranged at the corners of the square cell;

FIG. 4 demonstrates the the rerouting of conductors by arcuate segments within a grid cell to make room for the additional via without disturbing the positions of through holes and vias located at the corners of the square grid cell;

FIG. 5 is a table showing possible locations for the additional via to make any one of a number of connections set forth in the table, identification of individual ones of the conductors being shown in FIG. 4.

DETAILED DESCRIPTION

The invention provides for the emplacement of an additional via among through holes of a printed circuit board without interference with an established grid arrangement of the through holes and vias. The printed circuit board is understood to comprise plural layers of electrical conductors spaced apart by an insulating layer with an array of links, particularly through holes and vias, linking the various layers. The standard form of grid pattern for a printed circuit board is an array of square cells set out parallel to othorgonal axes of a Cartesian coordinate system. Corners of the cells define points of the grid. Through holes and vias are set in alternating fashion at the grid points. The central region of each cell is clear of lands of the through holes and the vias, and provides space for the passage of multiple-conductor channels which provide electrical communication among terminals of electrical components mounted on the through holes. The invention applies also to an array of links in which the through holes and vias are set out at the grid points in an arrangement which need not be an alternating pattern of through holes and vias. The invention applies further to grids which may have a unit cell other than a square cell, such as a triangular cell. In the following description, the invention will be described with reference to a standard form of printed circuit board in which through holes and vias are arranged in alternating fashion along the vertices of cells in a grid of square cells.

Figure 1:
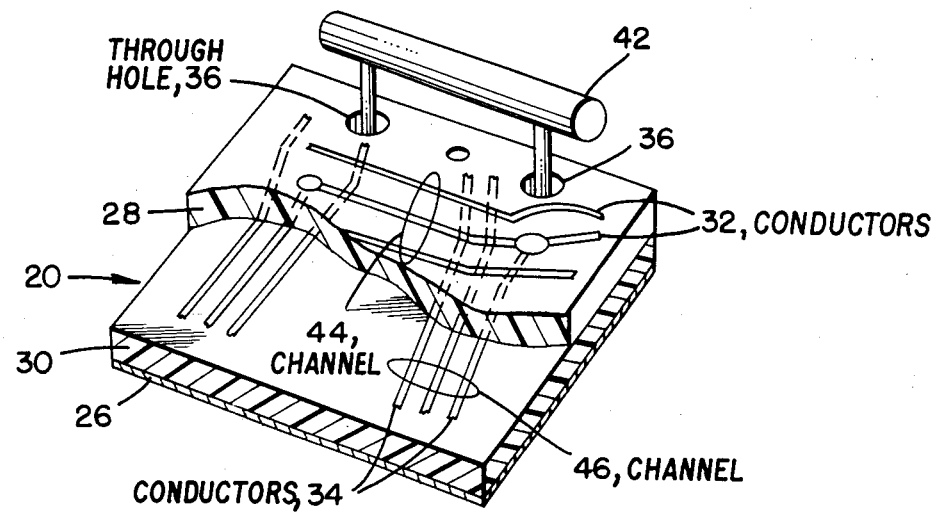
FIG. 1 shows a stylized view of a printed circuit board having conductor channels disposed on plural layers of the board.
Figure 2:
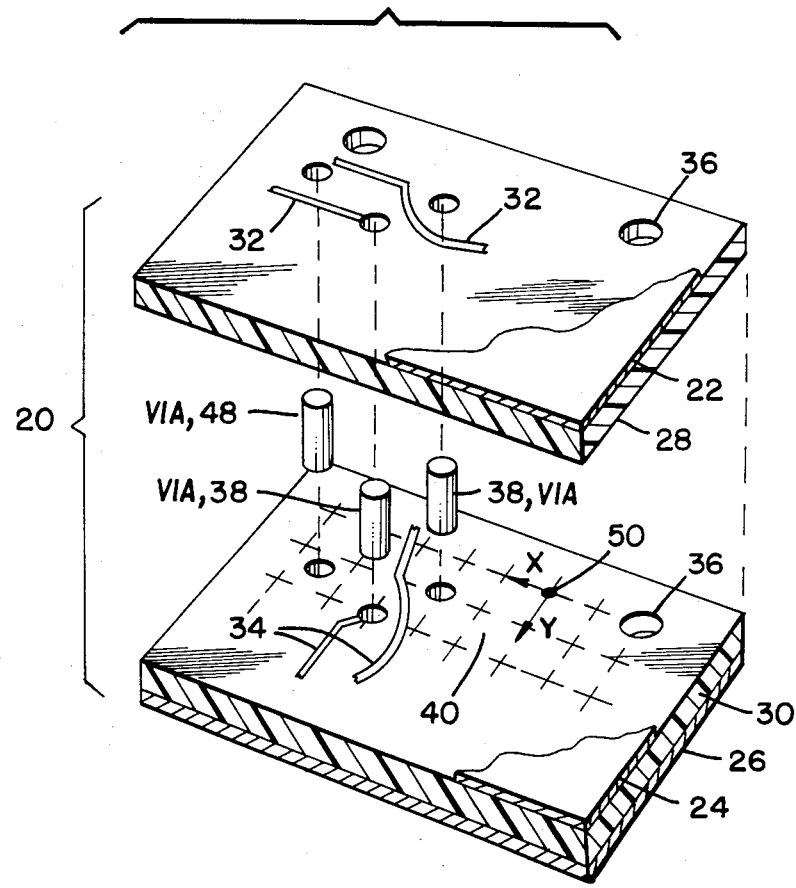
FIG. 2 shows a portion of the board of FIG. 1 with an additional via of the invention making connection between conductors of multiple-conductor channels of different layers of the board, the view being in exploded form to show interconnection between conductors by means of the additional via.

FIGS. 1 and 2 show a printed circuit board 20 formed three metallic layers 22, 24 and 26 spaced apart by insulating layers 28 and 30. While electrical conductors may be formed in all three of the metallic layers 22, 24 and 26, the construction of the board 20 has been simplified by the construction of conductors 32 and 34, respectively, in the upper layer 22 and the lower layer 24 only, while the bottom layer 26 remains intact in that no conductors are constructed therein. In FIG. 1, the upper insulating layer 28 has been partially cut away in the drawing to show the conductors 34 which have been formed in the well-known fashion of etching away portions of the lower metallic layer 24 to form the conductors 34. The upper conductors 32 have been formed similarly by the etching process. The metallic layers may comprise copper or other electrically conductive material, and the insulating layers may comprise a blend of fibrous glass and epoxy or other well-known electrically insulating material. The layers are linked by through holes 36 and vias 38 such that the through holes 36 pass through all three metallic layers 22, 24, 26 and both insulating layers 28 and 30, while the vias 38 pass through the upper insulating layer 28 to connect electrically upper conductors 32 with lower conductors 34. The sites of the through holes 36 and the vias 38 are located in alternating fashion on the points of a grid 40 of square-shaped unit cells set out parallel to the orthogonal coordinate axes of a Cartesian coordinate system. Electrical components 42, which may be chip circuits or discrete components, are mounted to the board 20 via insertion of their leads into the through holes 36.

In the practice of the invention it is understood that the upper conductors 32 are routed in channels 44 comprising at least three conductors, typically five conductors, which are spaced apart for electrical insulation, and are disposed along parallel paths which may be partly straight and partly sinuous. The lower conductors 34 are routed similarly in channels 46. The channels 44 and 46 thread among the sites of the through holes 36 and the vias 38. As will be described in further detail below, there is space along the edge of a unit cell sufficient to clear a channel 44, 46 between the lands of a through hole 36 and a via 38, but insufficient for insertion of an additional via. However, in the center of a unit cell, there is sufficient space both for the routing of a channel 44, 46 and for the insertion of an additional via.

In accordance with the invention, an additional via 48 is emplaced in a central region of one of the unit cells of the grid 40 to make electrical connection between a conductor 32 of upper channel 44 and a conductor 34 of lower channel 46. The paths of the two channels 44 and 46 are seen to cross, as viewed from above the board 20, so that the via 48 can provide connection between any conductor 32 of channel 44 and any conductor 34 of channel 46 by appropriate positioning of the via 48 in the central portion of the unit cell. The positioning of the via 48 is accomplished in cooperation with a displacement of the conductors 32 and 34 by the development of arcuate segments as will be described below.

With reference to FIG. 3, there is shown an enlarged plan view of a portion of the top surface of the board 20, the portion shown in Fig, 3 being approximately one unit cell. The dimensions shown are in mils. These dimensions include the diameters of lands of through holes 36, and the diameters of lands of vias 38. The through holes 36 are positioned at opposite corners of the unit cell, and the vias 38 are positioned at the remaining opposite corners of the unit cell. The lands have dimensions of 35 mils and 15 mils, respectively, for the through holes 36 and the vias 38. Each of the conductors 32 has a width of 2 mils. The spacing between conductors 32, as measured from edge to edge, is 3.5 mils.

Thus, the available space for either of the channels around the additional via at a central location in the cell is approximately twice the total of the widths of the conductors in either of the channels.

Also shown in FIG. 3 are three possible positions of the additional via 48. It is noted that the conductors 32 travel along sinuous paths in order to pass between the through holes 36 and the vias 38. In addition, at a possible site of an additional via 48, the conductors 32 are further separated so as to provide space for the via 48. It is noted that no such sufficient space for the via 48 exists near an edge line of the unit cell. The edge lines are understood to pass between centers of the circles representing the lands of the through holes 36 and the vias 38. The description of FIG. 3 applies also to the conductors 34 of the lower layer.

In FIG. 4, there is shown a combined representation of an upper channel 44 and a lower channel 46 passing through a common unit cell, with the upper conductors 32 passing from right to left along the x direction of a Cartesian coordinate system, and with the lower conductors 34 passing in the Y direction of the coordinate system. The conductors 32 and 34 are provided with arcuate segments which are useful in providing spacing for passing around the additional via 48. It is to be understood that the arcuate path segments may be piecewise linear as in FIG. 3. In FIG. 4, the arcuate segments include both smooth arcs as well as piecewise linear segments which approximate a smooth curve for passage around an additional via 48. Also, it is noted that each of the arcuate segments is formed with a armature concentric with a grid point in one of the corners of the cell. The additional via 48 is not shown in FIG. 4, but will be shown subsequently in FIGS. 6–9 which present modifications of the arrangement of FIG. 4.

With reference to both FIGS. 4 and 5, the individual conductors 34, directed along the y axis of the coordinate system are identified further by legends A, B, C, D, and E. The individual conductors 32 disposed along the x axis of the coordinate system are identified further by the legends A', B', C', D', and E'. The same identifying legends appear in the table of FIG. 5. The legends A–E identifying the conductors 34 appear across the top of the table, and the legends A'–E' identifying the conductors 32 appear across the left side of the table. At intersections of the rows and the columns of the table, there appear pairs of numbers which represent the X and the Y coordinates of a possible site of the additional via 48 as measured from a grid point 50 located in the upper right corner of the unit cell of FIG. 4. The X and the Y coordinates extending from the grid point 50 are also shown in FIG. 4. The values are approximate because there is excess space available, from 0.5 mil to approximately 3 mils, and more, depending on location, for location of the via 48.

Figure 6:
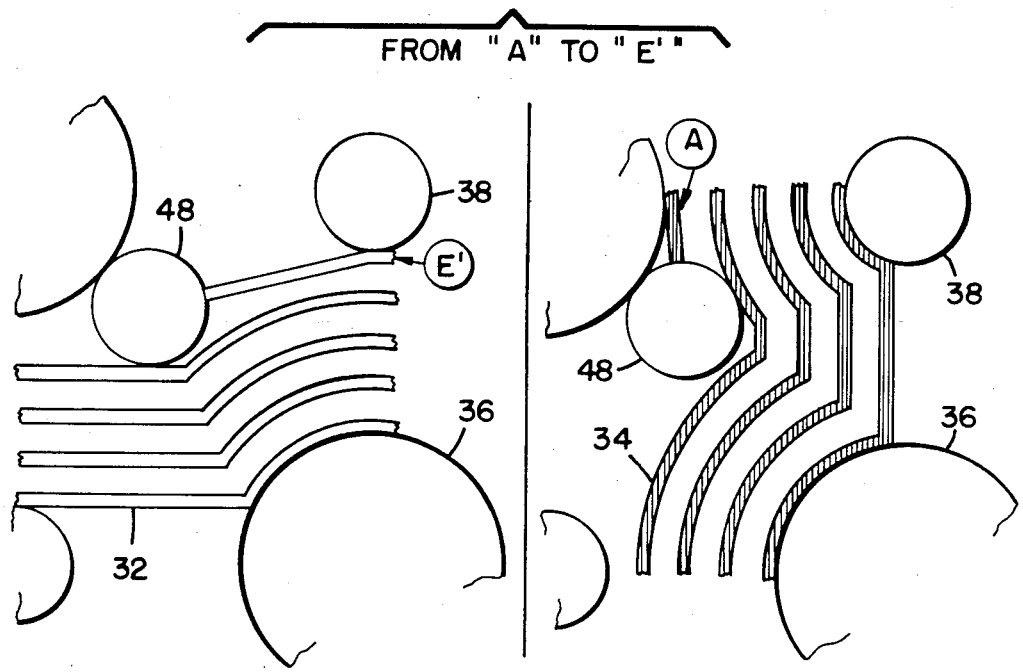
FIGS. 6–9 show positions of the conductors in upper and lower layers of the printed circuit board for accomplishing the connections set forth in the table of FIG. 5.

With reference to FIG. 6, there are shown two views of unit cells, the view on the left being a set of conductors 32 of the upper channel 44, this corresponding to the set of conductors 32 of FIG. 4, while the view on the right shows a set of conductors 34 of the lower channel 46, this corresponding to the conductors 34 of FIG. 4. Also shown in FIG. 6 is one possible location of the additional via 48, this being the location designated in the upper left corner of the table of FIG. 5 at the intersection of the column for conductor A and the row for conductor E'. In this location, the additional via 48 is connecting the conductor 34A with the conductor 32E'.

Figure 7:
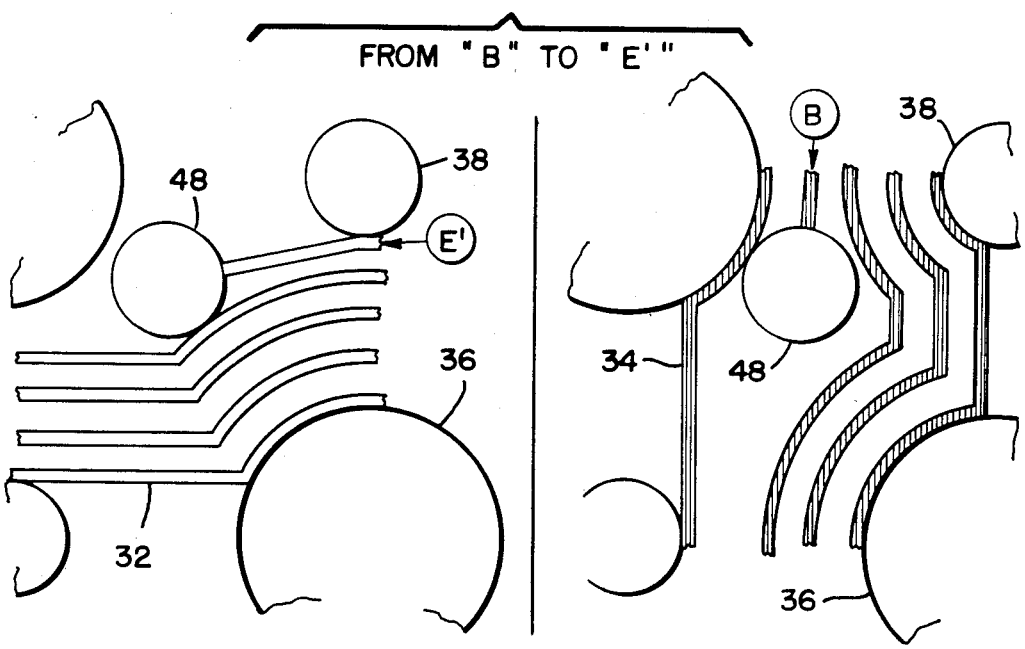
Figure 8:
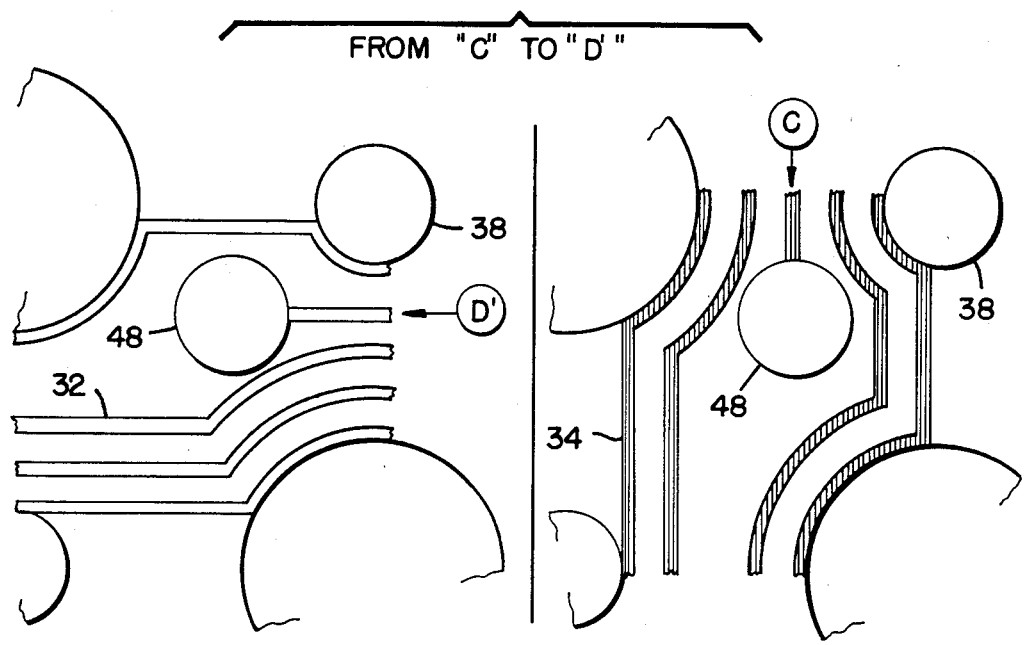
Figure 9:
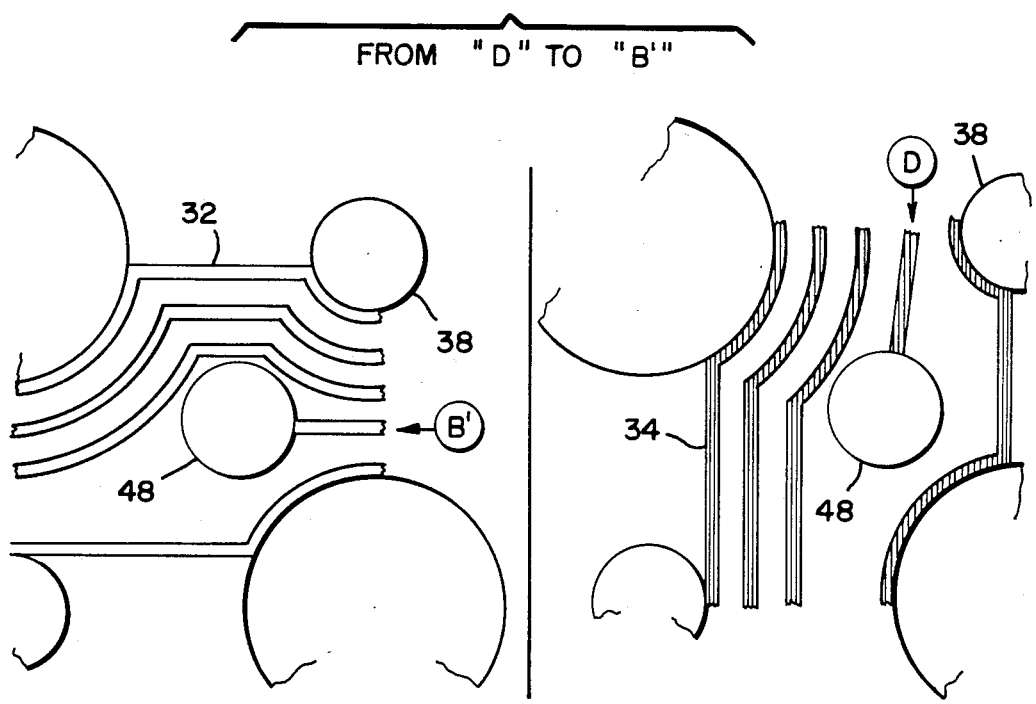

FIGS. 7–9 are constructed in the same fashion as is FIG. 6., with the conductors 32 of channel 44 and the conductors 34 of channel 46 being shown in a format similar to that disclosed in FIG. 4. In Fig. 7, the conductors of the channels 44 and 46 have been displaced in the central region of the unit cell to make room for the additional via 48 at the location designated in the table of FIG. 5 at the intersection of the column for conductor B and the row for conductor E'. This location of the additional via 48 provides for electrical connection between the conductors 34B and 32E'.

In a similar fashion, FIG. 8 shows the arrangements of the conductors of the channels 44 and 46 to enable positioning of the additional via 48 to connect conductor 34C with 32D'. The x and y coordinates of the location of the additional via 48 in FIG. 8 are shown in the table of FIG. 5 at the intersection of the column for conductor C and the row for conductor D. Similarly, FIG. 9 shows the locations of the conductors of the channels 44 and 46 which enable positioning of the additional via 48 for connecting the conductor 34D to the conductor 32B', the x and y coordinates of which position are shown in the table at the intersection of the column for conductor D and the row for conductor B'. It is noted that the table has symmetry due to symmetry about a diagonal of the unit cell of FIG. 4.

By symmetry, it is apparent that the locus of all possible locations of the additional via 48 fall within a central region of the unit cell, the periphery of the region approximating a rhombus. In the case of a unit cell bounded by four vias at the vertices of the cell or by four through holes at the vertices of the cell, the central region would have a shape approximating a square. In particular, it is noted that the central region of the unit cell has sufficient room to allow for a spreading apart of the conductors of a channel so as to allow for the insertion of the additional via 48. This is accomplished without interfering with the overall grid pattern of the locations of the through holes 36 and the vias 38.

In the example presented in FIG. 4, there are five conductors in each of the channels 44 and 46. It is to be understood, however, that the channels 44 and 46 may contain other members of conductors. For example, each channel may contain only four conductors, or one channel may contain four conductors while the other channel contains five conductors. In each of these situations, the conductors in each of the channels 44 and 46 are arranged with outer conductors that can be readily connected to the vias 38 at the fixed grid sites, while the remaining inner conductors, disposed between the outer conductors, do not contact the vias 38 at th fixed grid sites. However, any of these conductors can be brought into contact with the additional via 48 by routing the other conductors in both of the channels 44 and 46 via curved or piecewise arcuate sections of conductor around the additional via 48. In the case of the five-conductor channel, such as the channel 46 in FIG. 4, the conductors 34A and 34E are outer conductors while the conductors 34B, 34C, and 34D are inner conductors. The table for a four by five or four by four array may be constructed in a fashion similar to that of the table for the five by five array of FIG. 5.

With reference again to FIGS. 1 and 2, it is noted that, if desired, conductors (not shown) may be constructed in the bottom layer 26, and the vias 38 can extend through the lower layer 24 to make electrical contact between conductors of the upper layer 22 and the conductors of the bottom layer 26. Also, the board 20 may be constructed with still further metallic layers spaced apart by insulating layers (not shown) with the fixed-location vias 38 as well as the variable-position additional vias 48 being extended so as to make electrical contact between the conductors of any two of the layers or between conductors of more than two of the layers. In addition, the channels of the various layers may have equal or unequal members of conductors therein as may be required for making connection with electrical components mounted to the board 20. Also, such electrical components can be mounted on the bottom layer as well as on the upper layer of the board 20.

It is to be understood that the above-described embodiments of the invention are illustrative only, and that modifications thereof may occur to those skilled in the art. Accordingly, this invention is not to be limited to the embodiments disclosed herein, but is to be limited only as defined by the appended claims.

What is claimed is:

1. A printed circuit board comprising:

a board comprising a first plane and a second plane of strip conductors, said board having a plurality of connecting links disposed normal to and extending between said first plane and said second plane, wherein each link is a through hole or via, said links being located at grid points of an orthogonal Cartesian coordinate grid;

a first channel of strip conductors disposed in said first plane and passing through cells of said grid and among links of said circuit board, said conductors of said first channel being spaced apart from each other, said conductors of said first channel including outer conductors disposed along peripheral edges of said first channel and inner conductors disposed between said outer conductors;

a second channel of strip conductors disposed in said second plane and passing through cells of said grid and among links of said circuit board, said conductors of said second channel being spaced apart from each other, said conductors of said second channel including outer conductors disposed along peripheral edges of said second channel and inner conductors disposed between said outer conductors of said second channel;

an electrically insulating layer disposed between said first plane and said second plane;

an additional via disposed in a central region of a cell of said grid for making electrical contact between a designated conductor of said first channel and a designated conductor of said second channel; and wherein in each of said channels, conductors other than said designated conductors are formed with arcuate segments routing said other conductors around said additional via, the central region of said grid cell providing sufficient space between a link located at the periphery of said grid cell to accommodate said additional via and said arcuate segments; and wherein first and second through holes are located on grid points of one pair of opposite corners of said cell, and first and second vias are located on grid points at a second pair of opposite corners of said cell, the available space for either of said channels around said additional via at a central location in said cell being approximately twice the total of the widths of the conductors in either of said channels: and wherein in each of said arcuate segments, curvature of the segment is concentric with a grid point in one of the corners of said cell.

2. A board according to claim 1 wherein said through holes and vias are arranged in alternating fashion at grid points throughout said grid, and wherein said central region of said grid cell has a generally rhombic shape.

3. A board according to claim 1 wherein each of said channels includes at least four conductors.

4. A board according to claim 1 wherein each of said channels includes at least five conductors.

* * * * *